United States Patent
Oda

(10) Patent No.: US 7,619,196 B2
(45) Date of Patent: Nov. 17, 2009

(54) IMAGING DEVICE INCLUDING A MULTIPLIER ELECTRODE

(75) Inventor: Masahiro Oda, Itami (JP)

(73) Assignee: Sanyo Electric Co., Ltd., Osaka (JP)

( * ) Notice: Subject to any disclaimer, the term of this patent is extended or adjusted under 35 U.S.C. 154(b) by 281 days.

(21) Appl. No.: 11/670,861

(22) Filed: Feb. 2, 2007

(65) Prior Publication Data
US 2007/0176213 A1 Aug. 2, 2007

(30) Foreign Application Priority Data

Jan. 31, 2006 (JP) .............................. 2006-021609
Dec. 8, 2006 (JP) .............................. 2006-332509

(51) Int. Cl.
*H01L 27/00* (2006.01)
*H04N 3/14* (2006.01)

(52) U.S. Cl. .................................. 250/208.1; 348/311
(58) Field of Classification Search ........... 250/214 VT, 250/207, 208.1; 348/311
See application file for complete search history.

(56) References Cited

U.S. PATENT DOCUMENTS

| | | | | |
|---|---|---|---|---|
| 4,912,536 | A * | 3/1990 | Lou ........................... | 257/229 |
| 5,401,952 | A * | 3/1995 | Sugawa ....................... | 250/208.1 |
| 6,278,142 | B1 * | 8/2001 | Hynecek ....................... | 257/247 |
| 6,936,806 | B1 * | 8/2005 | Kitamura et al. .......... | 250/208.1 |
| 7,045,754 | B2 * | 5/2006 | Manabe et al. ............ | 250/208.1 |
| 7,372,495 | B2 * | 5/2008 | Takayanagi et al. ......... | 348/314 |
| 2005/0151867 | A1 | 7/2005 | Goto et al. | |

FOREIGN PATENT DOCUMENTS

| | | |
|---|---|---|
| JP | 07-030816 A | 1/1959 |
| JP | 04-125965 A | 4/1992 |
| JP | 7-176721 | 7/1995 |
| JP | 2005-064304 A | 3/2005 |
| JP | 2005-184479 | 7/2005 |
| JP | 2005-268564 A | 9/2005 |
| JP | 2006-332509 | 5/2008 |

OTHER PUBLICATIONS

English translation for JP 07-030816.*
Sudhir K. Madan, "Experimental Observation of Avalanche Multiplication of Charge-Coupled Devices," IEEE Transactions on Electron Devices, Jun. 1983, pp. 694-699, vol. Ed-30, No. 6.
Chinese Office Action for corresponding CN Application No. 2007100047968, Oct. 10, 2008, China.

* cited by examiner

*Primary Examiner*—Thanh X Luu
(74) *Attorney, Agent, or Firm*—Ditthavong, Mori & Steiner, P.C.

(57) ABSTRACT

An imaging device capable of multiplying carriers and miniaturizing the device is obtained. The imaging device includes a carrier storage portion for storing carriers generated by photoelectric conversion, having a photoelectric conversion function, a multiplier section including a multiplier electrode applying an electric field for multiplying carriers due to impact ionization by an electric field, one first transfer electrode so provided between the carrier storage portion and the multiplier electrode as to be adjacent to the carrier storage portion and the multiplier electrode.

17 Claims, 9 Drawing Sheets

IMAGING DEVICE INCLUDING A MULTIPLIER ELECTRODE

BACKGROUND OF THE INVENTION

1. Field of the Invention

The prevent invention relates to an imaging device, and more particularly, it relates to an imaging device comprising a multiplier section for multiplying electrons.

2. Description of the Background Art

A CCD (charge coupled device) image sensor (imaging device) comprising a multiplier section for multiplying electrons is known in general.

FIG. 12 is a sectional view showing a structure of the conventional CCD image sensor. With reference to FIG. 12, in an exemplary conventional CCD image sensor, a gate oxide 102 is formed on a surface of a silicon substrate 101. Four gate electrodes 103 to 106 are provided in prescribed regions on an upper surface of the gate oxide 102 at prescribed intervals. The CCD image sensor is so formed that four-phase clock signals Φ1 to Φ4 are supplied to the gate electrodes 103 to 106. A pixel separation barrier, a temporary storage well, a charge transfer barrier and a charge accumulation well are formed in a transfer channel 107 located under the gate electrodes 103 to 106, respectively. This pixel separation barrier separates the temporary storage well and the charge accumulation well of an adjacent pixel, and has a function of transferring electrons in the charge accumulation well of the adjacent pixel to the temporary storage well. The temporary storage well has a function of temporarily storing electrons transferred from an adjacent pixel. The charge transfer barrier separates the temporary storage well and the charge accumulation well, and has a function of transferring electrons stored in the temporary storage well to the charge accumulation well. The charge accumulation well has a function of storing electrons transferred from the temporary storage well and also has a function as a multiplication region for multiplying electrons due to impact ionization by an electric field. A multiplier section is constituted by the charge accumulation well and the gate electrode 106. In other words, a high electric field region 109 adjusted to a high potential is formed in an interface between the charge transfer barrier and the charge accumulation well, and when the electrons stored in the temporary storage well is injected into the high electric field region 109, the injected electrons obtain energy from the high electric field region 109. Then, the electrons having obtained the energy collide with atoms of the silicon substrate 101 during movement in the high electric field region 109, and electrons and holes are generated by this impact. Among the generated electrons and holes, only the electrons are accumulated in the charge accumulation well by the electric field in the high electric field region 109. Thus, the electrons are multiplied. The multiplication of the electrons is performed in a process of transferring electrons generated by a photodiode 108 of a photodetection region.

A multiplication operation of the conventional CCD image sensor will be now described with reference to FIG. 12.

A high-level clock signal Φ1 is supplied to the gate electrode 103 to bring the gate electrode 103 into an ON-state, and the gate electrode 106 of the adjacent pixel is brought into an OFF-state. Thus, the electrons stored in the charge accumulation well of the adjacent pixel are transferred to the pixel separation barrier.

A high-level clock signal Φ2 is supplied to the gate electrode 104 to bring the gate electrode 104 into an ON-state, and a low-level clock signal Φ1 is supplied to the gate electrode 103 to bring the gate electrode 103 to an OFF-state. Thus, the electrons transferred to the pixel separation barrier are transferred to the temporary storage well.

Then, a high-level clock signal Φ4 is supplied to the gate electrode 106 to bring the gate electrode 106 into an ON-state. Thus, a high voltage is applied to the gate electrode 106, and the high electric field region 109 is formed in the interface between the charge transfer barrier and the charge accumulation well. After that, while the gate electrode 106 remains in the ON-state, a low-level clock signal Φ2 is supplied to the gate electrode 104 to bring the gate electrode 104 into an OFF-state, whereby the electrons stored in the temporary storage well are transferred to the charge accumulation well over the charge transfer barrier. Thus, the transferred electrons are multiplied due to impact ionization by a high electric field, and the multiplied electrons are stored in the charge accumulation well. A constant voltage is supplied to the gate electrode 105, whereby the charge transfer barrier is adjusted to a prescribed potential and stays constant.

FIG. 13 is a sectional view in a case where a structure of the conventional CCD image sensor shown in FIG. 12 is applied to a CMOS (complementary metal oxide semiconductor) image sensor (imaging device). With reference to FIG. 13, in a CMOS image sensor to which the structure of the conventional CCD image sensor is applied, an n-type impurity region 201a is formed in a prescribed region in the vicinity of a surface of the silicon substrate 201 and a gate oxide 202 is formed in a region corresponding to the n-type impurity region 201a on the surface of the silicon substrate 201. A gate electrode 207 for transferring electrons to a floating diffusion region 208 and reading data is further provided in a prescribed region on an upper surface of the gate oxide 202 in addition to four gate electrodes 203 to 206 having a function similar to the conventional CCD image sensor. In the CMOS image sensor to which the structure of the conventional CCD image sensor is applied, the photodiode 209 generating electrons, the floating diffusion region 208 and the aforementioned five gate electrodes 203 to 207 are provided in one pixel.

In the conventional CCD image sensor shown in FIG. 12, however, the three gate electrodes 103 to 105 for forming the pixel separation barrier, the temporary storage well and the charge transfer barriers respectively are disadvantageously required in order to transfer the electrons (carriers) transferred from the photodiode 108 to the charge accumulation well which is the multiplication region for multiplying electrons. Thus, it is disadvantageously difficult to miniaturize the imaging device (CCD image sensor). Also in a case where the structure of the conventional image sensor is applied to the CMOS image sensor, the three gate electrodes 203 to 205 for forming the pixel separation barrier, the temporary storage well and the charge transfer barrier respectively are disadvantageously required in order to transfer the electrons (carriers) generated in the photodiode 209 to the charge accumulation well which is the multiplication region for multiplying electrons, similarly to a case of the aforementioned conventional CCD image sensor. Thus, also in a case where the structure of the conventional CCD image sensor is applied to a CMOS image sensor, it is disadvantageously difficult to miniaturize the imaging device (CMOS image sensor) similarly to the case of the aforementioned conventional CCD image sensor.

SUMMARY OF THE INVENTION

The present invention has been proposed in order to solve the aforementioned problem, and an object of the present invention is to provide an imaging device capable of multiplying carriers and miniaturizing the device.

In order to attain the aforementioned object, an imaging device according to an aspect of the present invention comprises a carrier storage portion for storing carriers generated by photoelectric conversion, having a photoelectric conversion function, a multiplier section including a multiplier electrode applying an electric field for multiplying carriers due to impact ionization by an electric field, and one first transfer electrode so provided between the carrier storage portion and the multiplier electrode as to be adjacent to the carrier storage portion and the multiplier electrode. It is to be noted that the carriers in the present invention mean electrons or holes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings. In the following description of the embodiments, the present invention is applied to a passive CMOS image sensor, which is an exemplary imaging device.

First Embodiment

A structure of a CMOS image sensor according to a first embodiment will be now described with reference to FIGS. 1 to 4.

Figure 1:
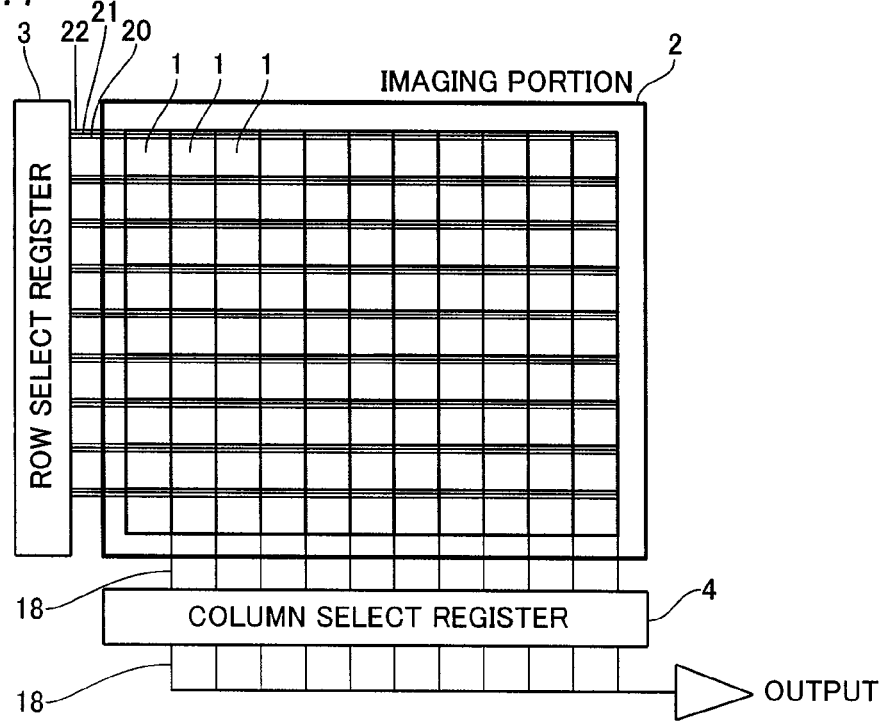
FIG. 1 is a plan view showing an overall structure of a CMOS image sensor according to a first embodiment of the present invention.
Figure 2:
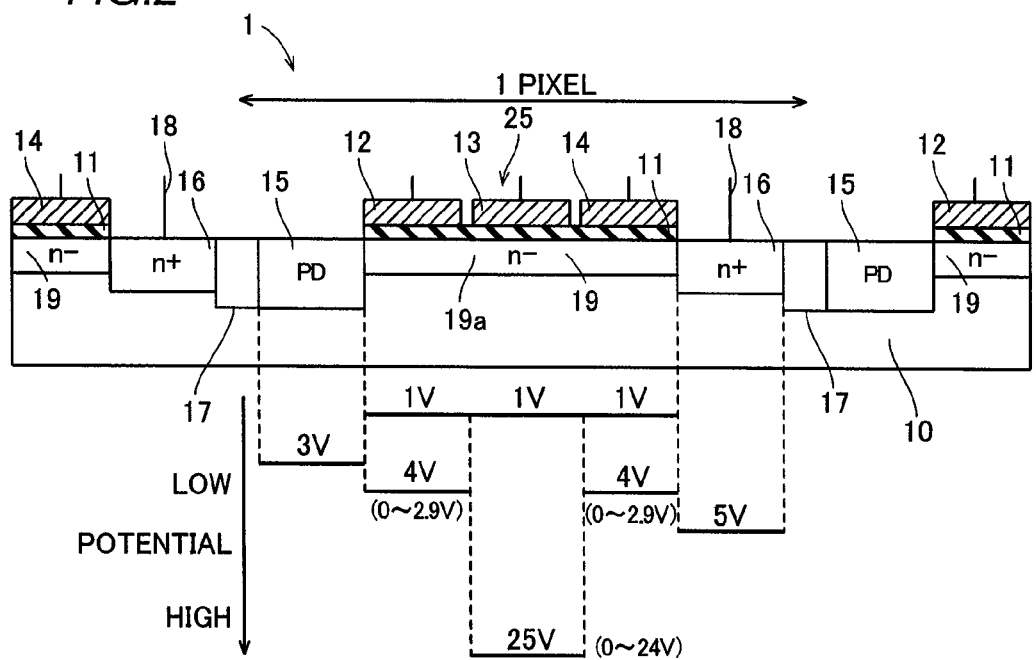
FIG. 2 is a sectional view showing the structure of the CMOS image sensor according to the first embodiment shown in FIG. 1.

The CMOS image sensor according to the first embodiment comprises an imaging portion 2 including a plurality of pixels 1, a row select register 3 and a column select register 4 as shown in FIG. 1. Each pixel 1 is constituted by a p-type silicon substrate 10, a gate insulating film 11, three gate electrodes of one transfer gate electrode 12, one multiplication gate electrode 13 and one readout gate electrode 14, a photodiode portion (PD) 15, a floating diffusion region 16 consisting of an n-type impurity region and an element separation region 17, as shown in FIG. 2. The gate insulating films 11 are formed on a surface of the p-type silicon substrate 10 at prescribed intervals. The transfer gate electrode 12, the multiplication gate electrode 13 and the readout gate electrode 14 are formed in prescribed regions of an upper surface of each gate insulating film 11 at prescribed intervals. Each photodiode portion 15 are formed in the vicinity of the surface of the p-type silicon substrate 10, and has a function of generating electrons according to an amount of incident light and storing the generated electrons. The photodiode portions 15 are examples of the "carrier storage portion" in the present invention, and the floating diffusion regions 16 are examples of the "carrier-number-based voltage converting portion" in the present invention. The readout gate electrodes 14 are examples of the "readout electrode" in the present invention.

According to the first embodiment, each transfer gate electrode 12 is so formed between the photodiode portion 15 and the multiplication gate electrode 13 as to be adjacent to the photodiode portion 15 and the multiplication gate electrode 13. The transfer gate electrodes 12 are examples of the "first transfer electrode" in the present invention, and the multiplication gate electrodes 13 are the "multiplier electrode" in the present invention.

Each floating diffusion region 16 consisting of an n-type impurity region is formed on the surface of the p-type silicon substrate 10 and is provided for converting a charge signal by transferred electrons to a voltage. The floating diffusion region 16 is so formed as to face the photodiode portion 15 through the transfer gate electrode 12, the multiplication gate electrode 13 and the readout gate electrode 14 and be adjacent to the readout gate electrode 14. Each transfer channel 19 consisting of an n-type impurity region is formed in the vicinity of a surface of the p-type silicon substrate 10 located between the photodiode portion 15 and the floating diffusion region 16. The transfer channel 19 has an impurity concentration ($n^-$) lower than an impurity concentration ($n^+$) of the floating diffusion region 16. The transfer channels 19 are examples of the "first transfer channel" in the present invention. Each element separation region 17 is formed in the vicinity of the surface of the p-type silicon substrate 10 between the photodiode portion 15 and the floating diffusion region 16 of the adjacent pixel 1. The element separation region 17 has a function of inhibiting electrons generated by the photodiode portion 15 of the adjacent pixel 1 from being mixed into the floating diffusion region 16 in the pixel 1. No gate insulating film 11 is formed on the surface of the p-type silicon substrate 10 on which the photodiode portion 15, the floating diffusion region 16 and the element separation region 17 are formed, as shown in FIG. 2.

Figure 3:
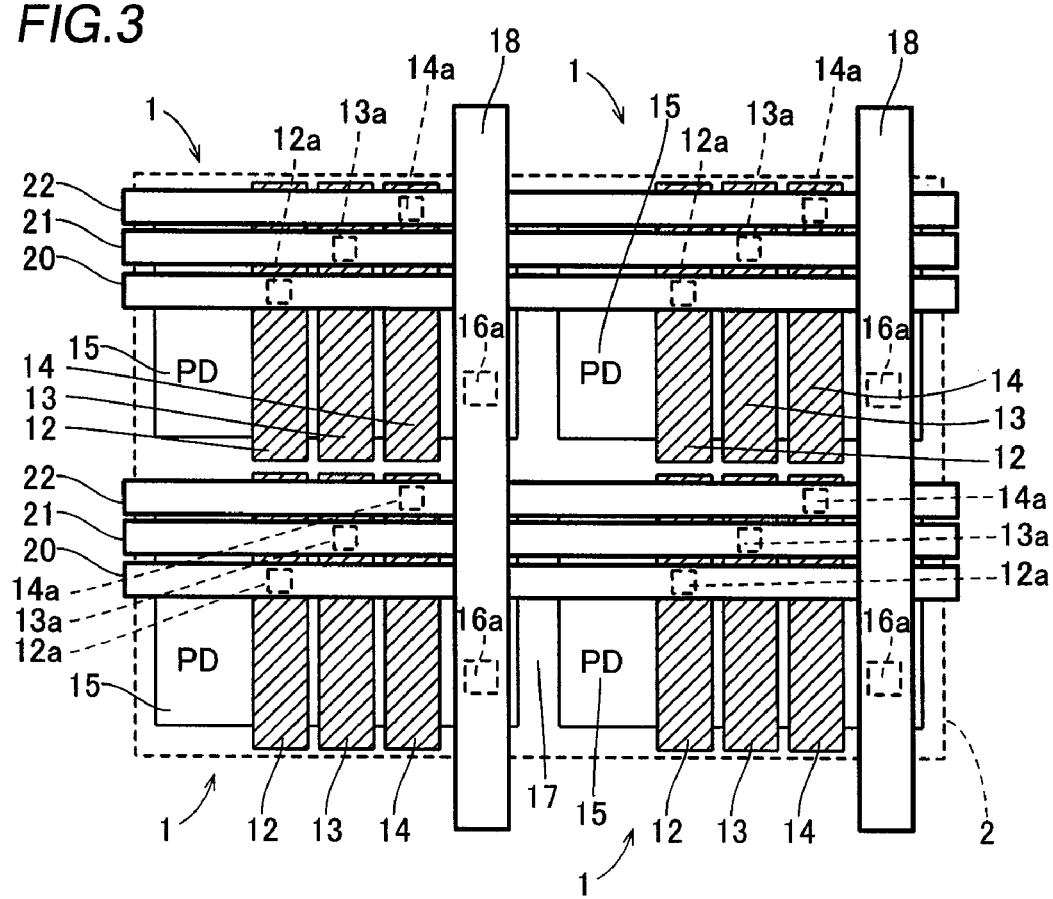
FIG. 3 is a plan view showing pixels of the CMOS image sensor according to the first embodiment shown in FIG. 1.

As shown in FIG. 3, wiring layers 20, 21 and 22 for supplying clock signals for voltage control are electrically connected to the transfer gate electrodes 12, the multiplication gate electrodes 13 and the readout gate electrodes 14 through contact portions 12a, 13a and 14a, respectively. Signal lines 18 for extracting a signal are electrically connected to the floating diffusion regions 16 at the contact portions 16a. The wiring layers 20, 21 and 22 are examples of the "second wiring layer", "first wiring layer" and "third wiring layer" in the present invention, respectively.

As shown in FIG. 2, an ON signal (high-level signal) of a clock signal is supplied to the transfer gate electrodes 12, the multiplication gate electrodes 13, and readout gate electrodes 14, whereby a voltage of about 2.9 V is applied to the transfer gate electrodes 12 and the readout gate electrodes 14 and a voltage of about 24V is applied to the multiplication gate electrodes 13. Thus, the transfer channels 19 located under the transfer gate electrodes 12 and the transfer channels 19 located under the readout gate electrodes 14 are adjusted to a potential of about 4 V and the transfer channels 19 located under the multiplication gate electrodes 13 are adjusted to a high potential of about 25V. In a state where an OFF signal (low-level signal) of the clock signal is supplied, the transfer channels 19 located under the transfer gate electrodes 12, both the transfer channels 19 located under the multiplication gate electrodes 13 and the transfer channels 19 located under the readout gate electrodes 14 are adjusted to a potential about 1 V. The photodiode portions 15 and the floating diffusion regions 16 are adjusted to potentials of about 3V and 5V, respectively. A potential of about 1 V, a potential of about 3V, a potential of about 4 V, a potential of about 5V and a potential of about 25V are examples of the "third potential", the "first potential", the "second potential", the "fifth potential" and the "fourth potential" in the present invention, respectively.

According to the first embodiment, each photodiode portion 15 has a function of generating electrons by photoelectric conversion and storing the generated electrons, as shown in FIG. 2. Each transfer gate electrode 12 has a function of transferring electrons stored in the photodiode portion 15 to the transfer channel 19 located under the multiplication gate electrode 13 by applying a voltage. A high voltage of about 24V is applied to the multiplication gate electrodes 13, whereby the transfer channels 19 located under the multiplication gate electrodes 13 are adjusted to a high potential (about 25V). Thus, high electric field regions 19a are formed in boundaries between the transfer channels 19 located under the transfer gate electrodes 12 and the transfer channels 19 located under the multiplication gate electrodes 13. When electrons stored in the photodiode portions 15 are transferred to reach the high electric field regions 19a, the transferred electrons are multiplied due to impact ionization by high electric fields of the high electric field regions 19a. Multiplier sections 25 are constituted by the multiplication gate electrodes 13 and the transfer channels 19 located under the multiplication gate electrodes 13.

Figure 4:
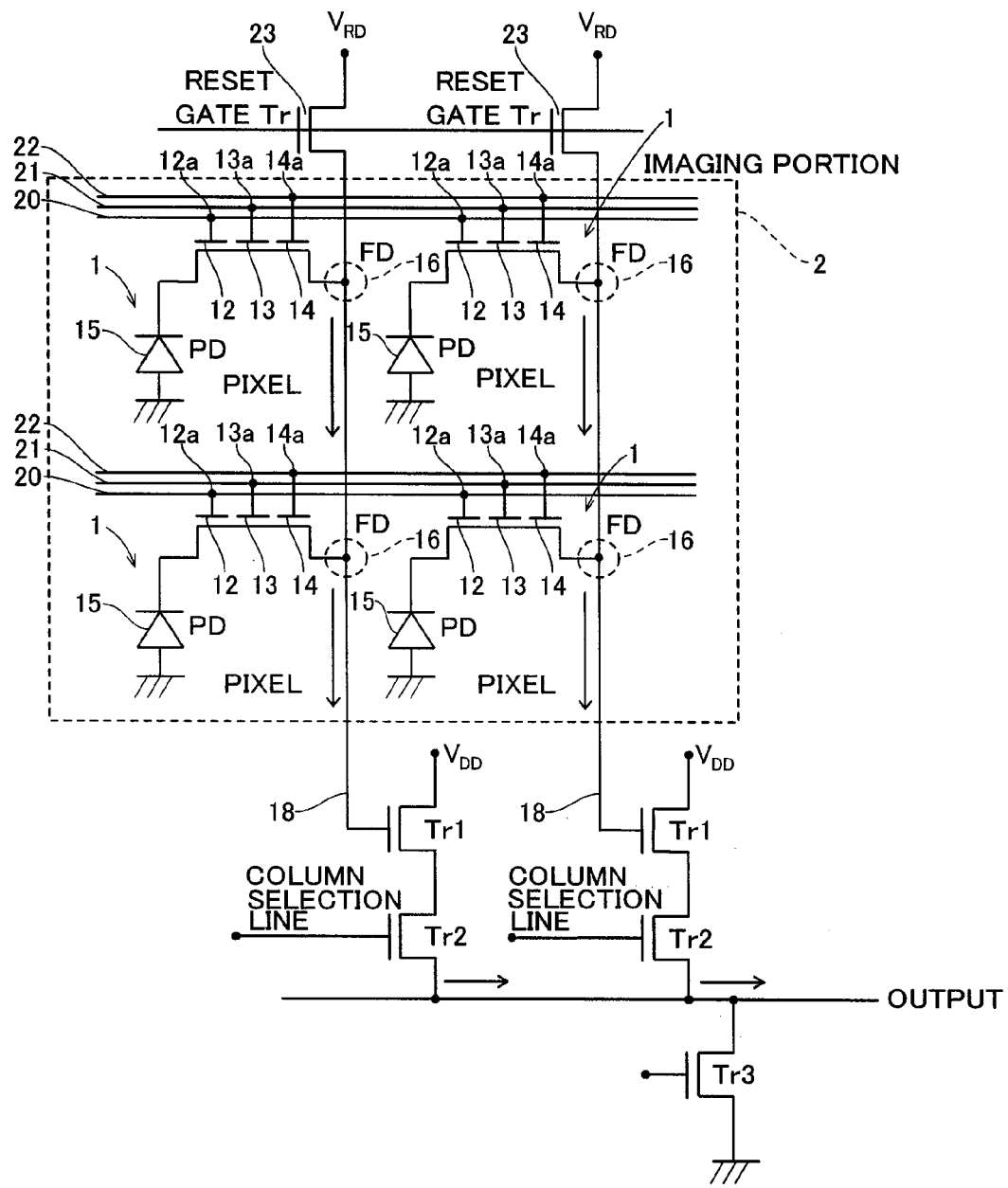
FIG. 4 is a circuit diagram showing the structure of the CMOS image sensor according to the first embodiment shown in FIG. 1.

Each readout gate electrode 14 has a function of transferring a charge signal by electrons multiplied by the high electric field region 19 to the floating diffusion region 16 for reading as a voltage signal by applying a voltage. The CMOS image sensor according to the first embodiment comprises reset gate transistors 23, transistors Tr1 and selection transistors Tr2 connected to the transistors Tr1 and one transistor Tr3, for extracting a signal for each column of the plurality of pixels 1 arranged in the form of a matrix in the imaging portion 2, as shown in FIG. 4. The reset gate transistors 23 have a function of resetting a voltage of the signal lines 18 to a reset voltage $V_{RD}$ (about 5V) after reading and holding the floating diffusion regions 16 electrically floated in reading. A reset signal is supplied to gates of the reset gate transistors 23. A reset voltage $V_{RD}$ (about 5V) is applied to drains of the reset gate transistors 23. Sources of the reset gate transistors 23 are connected to the signal lines 18. The signal lines 18 are connected to gates of the transistors Tr1, a power supply voltage $V_{DD}$ is connected to drains of the transistor Tr1, and drains of the selection transistors Tr2 are connected to sources of the transistors Tr1. Column selection lines are connected to gates of the selection transistor Tr2 and an output line is connected to sources of the selection transistors Tr2. A drain of the transistor Tr3 is connected to the output line, and a source of the transistor Tr3 is grounded. A prescribed voltage for making the transistor Tr3 function as a constant current source is applied to a gate of the transistor Tr3. The transistor Tr1 in each column and the transistor Tr3 constitutes a source follower circuit.

A readout operation of the CMOS image sensor according to the first embodiment will be now described with reference to FIG. 4. First, a high-level signal is supplied to the wiring layer 22 in a prescribed row, whereby the readout gate electrodes 14 of the pixels 1 in one row of the imaging portion 2 are brought into an ON-state. Thus, electrons generated in the photodiode portions 15 of the pixels 1 in one row are read to the signal lines 18. In this state, since the selection transistors Tr2 are in OFF-state, a current does not flow in the source follower circuits constituted by the transistors Tr1 and Tr3. From this state, a high-level signal is sequentially supplied to the column selection lines, whereby the selection transistors Tr2 are sequentially brought into an ON-state for the pixels 1 in one column of the imaging portion 2. Thus, a current is sequentially flows through the transistor Tr1 and the selection transistor Tr2 in each column and the transistor Tr3, whereby a signal for each pixel 1 is outputted. After all outputs are completed, the reset gate transistors 23 are brought into an ON-state, whereby the potential of the signal lines 18 is reset. The aforementioned operation is repeated, whereby the readout operation of the CMOS image sensor according to the first embodiment is performed.

A multiplication operation of the CMOS image sensor according to the first embodiment of the present invention will be described with reference to FIGS. 5 and 6.

Figure 5:
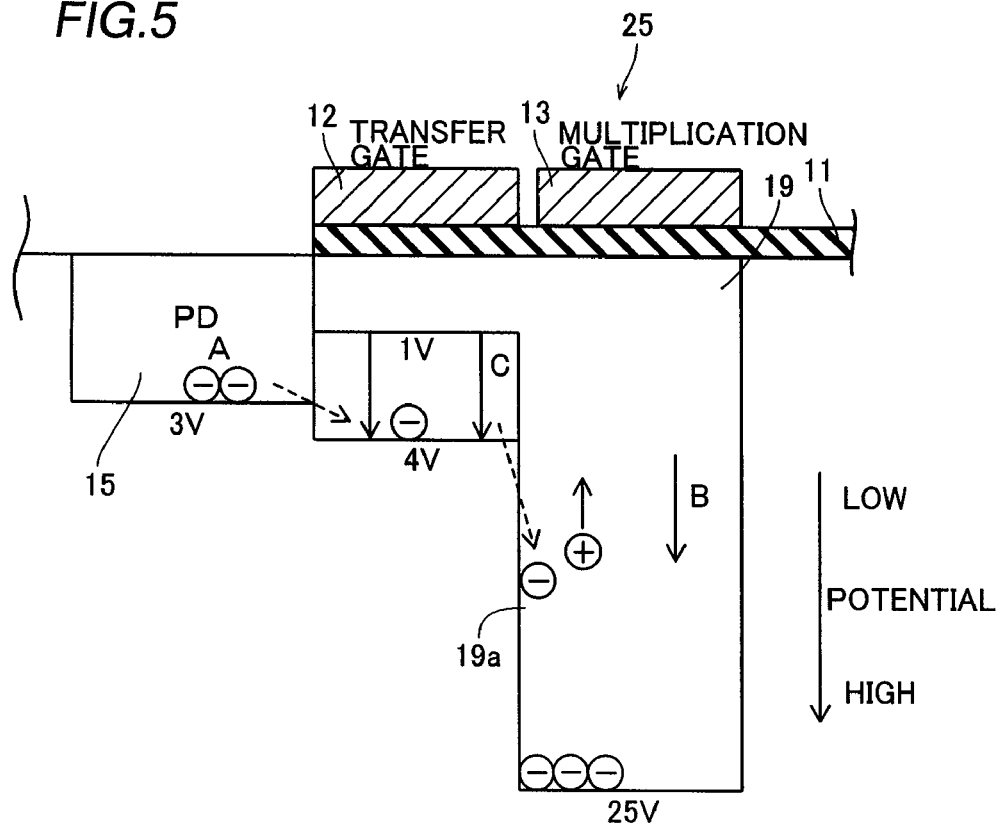
FIG. 5 is a sectional view for illustrating a multiplication operation of the CMOS image sensor according to the first embodiment shown in FIG. 1.
Figure 6:
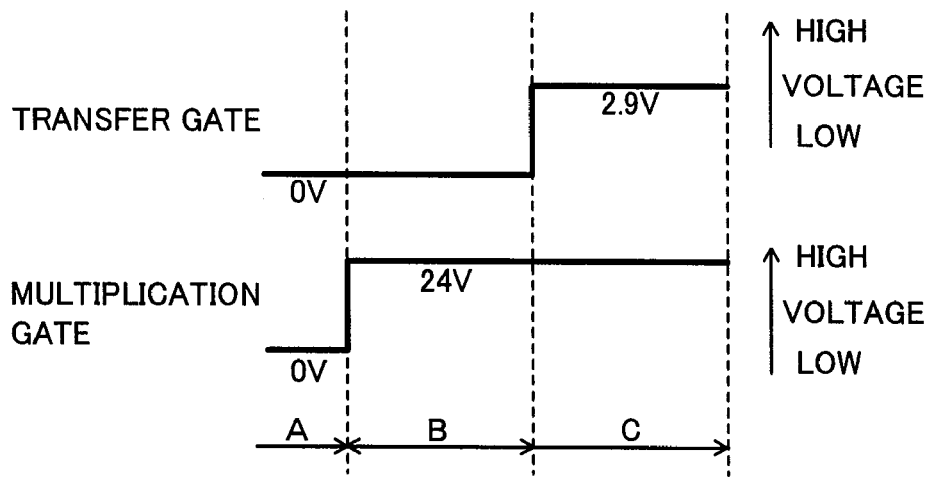
FIG. 6 is a signal waveform diagram for illustrating the multiplication operation of the CMOS image sensor according to the first embodiment shown in FIG. 1.

As shown in FIG. 5, when light is incident upon the photodiode portions 15, electrons are generated in the photodiode portions 15 by photoelectric conversion in period A in FIG. 6. Then, in period B in FIG. 6, the multiplication gate electrodes 13 are brought into an ON-state while the transfer gate electrodes 12 remain in an OFF-state, whereby a potential of the transfer channels 19 located under the multiplication gate electrodes 13 is adjusted to a potential of about 25V. At this time, the transfer channels 19 located under the transfer gate electrodes 12 are adjusted to a potential of about 1 V. The photodiode portions 15 are adjusted to a potential of about 3V, and hence the generated electrons are not transferred to the transfer channels 19 located under the transfer gate electrodes 12 having a potential lower than the photodiode portions 15 and stored in the photodiode portions 15.

In period C in FIG. 6, the multiplication gate electrodes 13 are held in an ON-state, and the transfer gate electrodes 12 are brought into an ON-state. In other words, the transfer channels 19 located under the transfer gate electrodes 12 are adjusted to a potential of about 4 V in a state where the transfer channels 19 located under the multiplication gate electrodes 13 are adjusted to a potential of about 25V. Thus, the electrons stored in the photodiode portions 15 are transferred to the transfer channels 19 located under the transfer gate electrodes 12 adjusted to a potential (about 4 V) higher than a potential (about 3V) of the photodiode portions 15, and the electrons transferred to the transfer channels 19 of the transfer gate electrodes 12 are transferred to the transfer channels 19 located under the multiplication gate electrodes 13 adjusted to a potential (about 25V) further higher than a potential (about 4 V) of the transfer channels 19 located under the transfer gate electrodes 12. At this time, the electrons transferred from the transfer channels 19 located under the transfer gate electrodes 12 to the transfer channels 19 located under the multiplication gate electrodes 13 obtain energy from the high electric fields of the high electric field regions 19a during movement in the high electric field regions 19a formed in the boundaries between the transfer channels 19 located under the transfer gate electrodes 12 and the transfer channels 19 located under the multiplication gate electrodes 13, and the electrons having obtained energy collide with silicon atoms to generate electrons and holes (impact ionization), thereby generating new electrons. Thereafter the electrons transferred from the photodiode portions 15 and the electrons generated due to impact ionization are stored in the transfer channels 19 located under the multiplication gate electrodes 13 by the electric fields of the high electric field regions 19a.

Figure 7:
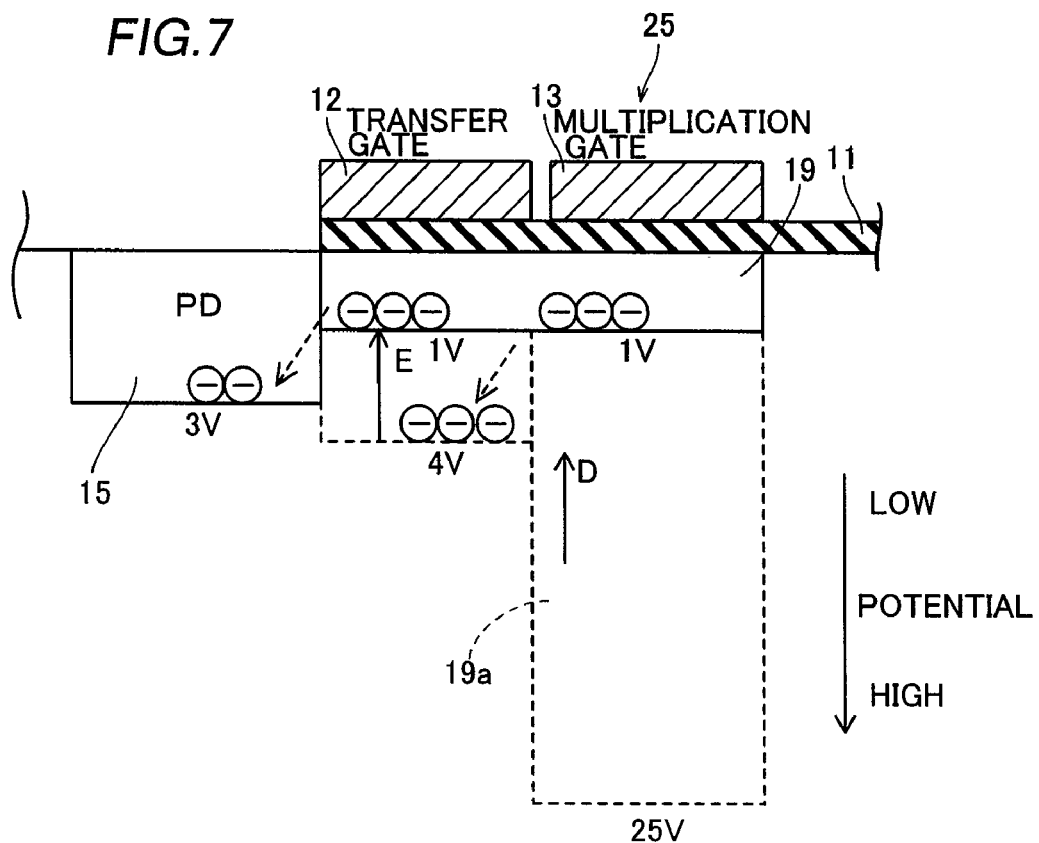
FIG. 7 is a sectional view for illustrating a reverse transfer operation of the CMOS image sensor according to the first embodiment shown in FIG. 1.

A reverse transfer operation of the CMOS image sensor according to the first embodiment of the present invention will be now described with reference to FIGS. 7 and 8. The reverse transfer operation means an operation for transferring electrons stored in the transfer channels 19 located under the multiplication gate electrodes 13 to the photodiode portions 15.

Figure 8:
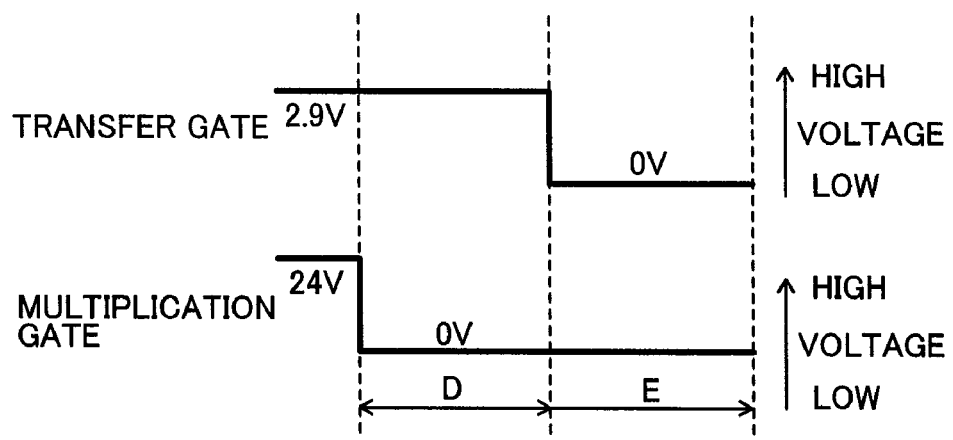
FIG. 8 is a signal waveform diagram for illustrating the reverse transfer operation of the CMOS image sensor according to the first embodiment shown in FIG. 1.

First, in period D in FIG. 8, the transfer gate electrodes 12 are held in an ON-state, and the multiplication gate electrodes 13 are brought into an OFF-state. Therefore, the transfer channels 19 located under the multiplication gate electrodes 13 are adjusted to a potential of about 1 V, in a state where the transfer channels 19 located under the transfer gate electrodes 12 are adjusted to a potential of about 4 V as shown in FIGS. 7 and 8. Thus, the electrons stored in the transfer channels 19 located under the multiplication gate electrodes 13 are transferred to the transfer channels 19 located under the transfer gate electrodes 12 adjusted to a potential (about 4 V) higher than a potential (about 1 V) of the transfer channels 19 located under the multiplication gate electrodes 13. Then, in period E in FIG. 8, the multiplication gate electrodes 13 are held in an OFF-state and the transfer gate electrodes 12 are also brought into an OFF-state. Therefore, in a state where the transfer channels 19 located under the multiplication gate electrodes 13 are adjusted to a potential of about 1 V, the transfer channels 19 located under the transfer gate electrodes 12 adjusted to a potential of about 4 V are also adjusted to a potential of about 1 V identical with the transfer channels 19 located under the multiplication gate electrodes 13. The photodiode portions 15 are adjusted to a potential (about 3V) higher than a potential (about 1 V) of the transfer channels 19 located under the transfer gate electrodes 12 and a potential (about 1 V) of the transfer channels 19 located under the multiplication gate electrodes 13. Therefore, electrons transferred to the transfer channels 19 located under the transfer gate electrodes 12 are transferred to the photodiode portions 15 adjusted to a higher potential. Thus, electrons stored in the transfer channels 19 located under the multiplication gate electrodes 13 are transferred to the photodiode portions 15. The electrons transferred to the photodiode portions 15 are transferred again from the photodiode portions 15 to the transfer channels 19 located under the multiplication gate electrodes 13 through the high electric field regions 19a by the aforementioned multiplication operation, and the aforementioned multiplication operation and the aforementioned reverse transfer operation are repeated. Thus, the multiplication of electrons is repeated, and the multiplied electrons are stored in the transfer channels 19 located under the multiplication gate electrodes 13 as a charge signal. The charge signal by the electrons thus multiplied and stored are read as a voltage signal through the floating diffusion regions 16 and the signal lines 18 as the aforementioned readout operation.

According to the first embodiment, as hereinabove described, the one transfer gate electrode 12 is so provided between the photodiode portion 15 and the multiplication gate electrode 13 as to be adjacent to the photodiode portion 15 and the multiplication gate electrode 13. Therefore, a voltage is applied to each transfer gate electrode 12 provided between the photodiode portion 15 and the multiplication gate electrode 13, whereby the electrons stored in each photodiode portion 15 can be transferred to the high electric field region 19a multiplying electrons due to impact ionization by an electric field. Accordingly, only the one transfer gate electrode 12 can transfer electrons from the photodiode portion 15 storing electrons to the high electric field region 19a for multiplying electrons. Thus, the number of the gate electrodes can be reduced dissimilarly to a case where three gate electrodes are used in order to temporarily store electrons and perform a transfer operation to the high electric field region 19a, whereby the device can be miniaturized.

According to the first embodiment, a voltage of each transfer gate electrode 12 is so controlled as to transfer electrons from the photodiode portion 15 to the high electric field region 19a after a voltage enabling multiplication of electrons due to impact ionization is applied to the multiplication gate electrode 13, whereby electrons can be transferred from the photodiode portion 15 storing electrons to the high electric field region 19a for multiplying electrons by controlling a voltage of the one transfer gate electrode 12. Therefore, only the one transfer gate electrode 12 can transfer electrons from the photodiode portion 15 storing electrons to the high electric field region 19a for multiplying electrons. Thus, the number of the gate electrodes can be reduced dissimilarly to a case where three gate electrodes are used in order to temporarily store electrons and perform a transfer operation to the high electric field region 19a, whereby the device can be easily miniaturized.

According to the first embodiment, voltages of the transfer gate electrodes 12 and the multiplication gate electrodes 13 are so controlled as to return electrons multiplied due to impact ionization to the photodiode portions 15, and a voltage of the transfer gate electrodes 12 is so controlled that the electrons returned from the transfer channels 19 located under the multiplication gate electrodes 13 to the photodiode portions 15 are transferred again to the high electric field regions 19a. Therefore, a multiplication operation of electrons due to impact ionization can be performed a plurality of times, whereby the multiplication factor of electrons can be improved. Thus, the number of electrons generated by the photodiode portions 15 can be more efficiently increased.

According to the first embodiment, a voltage of the transfer gate electrodes 12 is so controlled as to transfer electrons from the transfer channels 19 located under the multiplication gate electrodes 13 to the photodiode portions 15 after a voltage smaller than a voltage applied to the adjacent transfer gate electrodes 12 is applied to the multiplication gate electrodes 13, a potential of the transfer channels 19 located under the multiplication gate electrodes 13 is adjusted to a potential smaller than the transfer channels 19 located under the transfer gate electrodes 12, whereby electrons stored in the transfer channels 19 located under the multiplication gate electrodes 13 can be easily transferred to the transfer channels 19 located under the transfer gate electrodes 12 and electrons transferred to the transfer channels 19 located under the transfer gate electrodes 12 can be easily transferred to the photodiode portions 15 by controlling a voltage of the transfer gate electrodes 12.

According to the first embodiment, each readout gate electrode 14 is so positioned between the multiplication gate electrode 13 and the floating diffusion region 16 as to be adjacent to the multiplication gate electrode 13 and the floating diffusion region 16, whereby electrons stored in the transfer channels located under the multiplication gate electrodes 13 can be easily transferred to the floating diffusion regions 16 by applying a voltage to the readout gate electrodes 14.

According to the first embodiment, the common wiring layers 20, 21 and 22 are provided in the pixels 1 in each row, whereby voltages are applied to the transfer gate electrodes 12, the multiplication gate electrodes 13 and the readout gate electrodes 14 in the pixels 1 in each row through the wiring layers 20, 21 and 22. Thus, a structure of the device can be simplified dissimilarly to a case where wiring layers are provided for applying voltages to a transfer electrode, a multiplier electrode and a readout electrode in each pixel.

According to the first embodiment, each transfer channel 19 is so provided below the transfer gate electrode 12, the multiplication gate electrode 13 and the readout gate electrode 14 as to couple the photodiode portion 15 and the floating diffusion region 16, whereby voltages applied to the transfer gate electrode 12, the multiplication gate electrode 13 and the readout gate electrode 14 are controlled. Thus, electrons can be easily moved in the transfer channels 19.

According to the first embodiment, the element separation regions 17 for separating the pixels 1 are provided, whereby electrons of each pixel 1 can be inhibited from being mixed into the adjacent pixel 1. Thus, electrons corresponding to a signal in each pixel can be accurately read.

Second Embodiment

Figure 9:
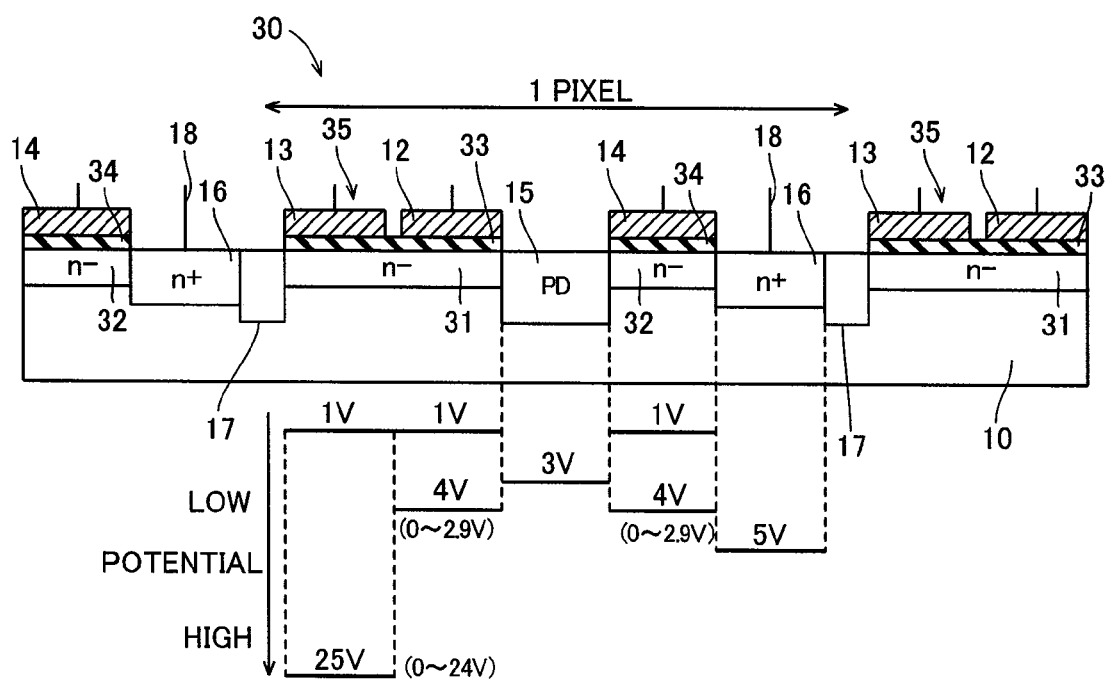
FIG. 9 is a sectional view showing a structure of a CMOS image sensor according to a second embodiment of the present invention.

With reference to FIG. 9, in a second embodiment, a structure of a CMOS image sensor including pixels 30 so formed that photodiode portions 15 are adjacent to readout gate electrodes 14 respectively will be described dissimilarly to the aforementioned first embodiment.

As shown in FIG. 9, in a cross-sectional structure of the pixels 30 of the CMOS image sensor according to the second embodiment, element separation regions 17 are formed on a surface of a p-type silicon substrate 10 for separating the pixels 30. The photodiode portion 15 is so formed on the surface of the p-type silicon substrate 10 of each pixel 30 surrounded by the element separation regions 17 as to hold a transfer channel 31 consisting of an n-type impurity region spaced at a prescribed interval from the one of the element separation regions 17. A floating diffusion region 16 is so formed on the surface of the p-type silicon substrate 10 of each pixel 30 as to hold a transfer channel 32 consisting of an n-type impurity region spaced at a prescribed interval from the photodiode portion 15. The transfer channels 31 and 32 have an impurity concentration (n⁻) lower than an impurity concentration (n⁺) of the floating diffusion regions 16. Each floating diffusion region 16 is so formed as to be adjacent to other element separation region 17. The transfer channels 31 and 32 are examples of the "second transfer channel" and the "third transfer channel" in the present invention respectively.

According to the second embodiment, gate insulating films 33 are formed on upper surfaces of the transfer channels 31. A transfer gate electrode 12 and a multiplication gate electrode 13 are formed in prescribed regions on the upper surface of each gate insulating film 33 at a prescribed interval. Each transfer gate electrode 12 is so formed as to be adjacent to the photodiode portion 15, and each multiplication gate electrode 13 is so formed as to be adjacent to one of the element separation regions. Gate insulating films 34 are formed on upper surfaces of the transfer channels 32. The readout gate electrodes 14 are formed in prescribed regions of upper surfaces of the gate insulating films 34. Each readout gate electrode 14 is so formed between the photodiode portion 15 and the floating diffusion region 16 as to be adjacent to the photodiode portion 15 and the floating diffusion region 16. Multiplier sections 35 are constituted by the transfer channels 31 located under the multiplication gate electrodes 13 and the multiplication gate electrodes 13.

According to the second embodiment, the transfer channels 31 located under the transfer gate electrodes 12 are adjusted to a potential of about 4 V in a case where an ON signal (high-level signal) of a clock signal is supplied to the transfer gate electrodes 12, and are adjusted to a potential of about 1 V in a case where an OFF signal (low-level signal) of the clock signal is supplied to the transfer gate electrodes 12. The transfer channels 31 located under the multiplication gate electrodes 13 are adjusted to a potential of about 25V in a case where an ON signal (high-level signal) of the clock signal is supplied to the multiplication gate electrodes 13, and are adjusted to a potential of about 1 V in a case where an OFF signal (low-level signal) of the clock signal is supplied to the multiplication gate electrodes 13. The transfer channels 32 located under the readout gate electrodes 14 are adjusted to a potential of about 4 V in a case where an ON signal (high-level signal) of the clock signal is supplied to the readout gate electrodes 14, and are adjusted to a potential of about 1 V in a case where an OFF signal (low-level signal) of the clock signal is supplied to the readout gate electrodes 14. The photodiode portions 15 and the floating diffusion regions 16 are adjusted to potentials of about 3V and about 5V, respectively. A potential of about 1 V, a potential of about 3V, a potential of about 4 V and a potential of about 5V are examples of the "ninth potential", the "sixth potential", the "eighth potential" and the "seventh potential" in the present invention, respectively.

The remaining structures of the second embodiment are similar to those of the aforementioned first embodiment.

Figure 10:
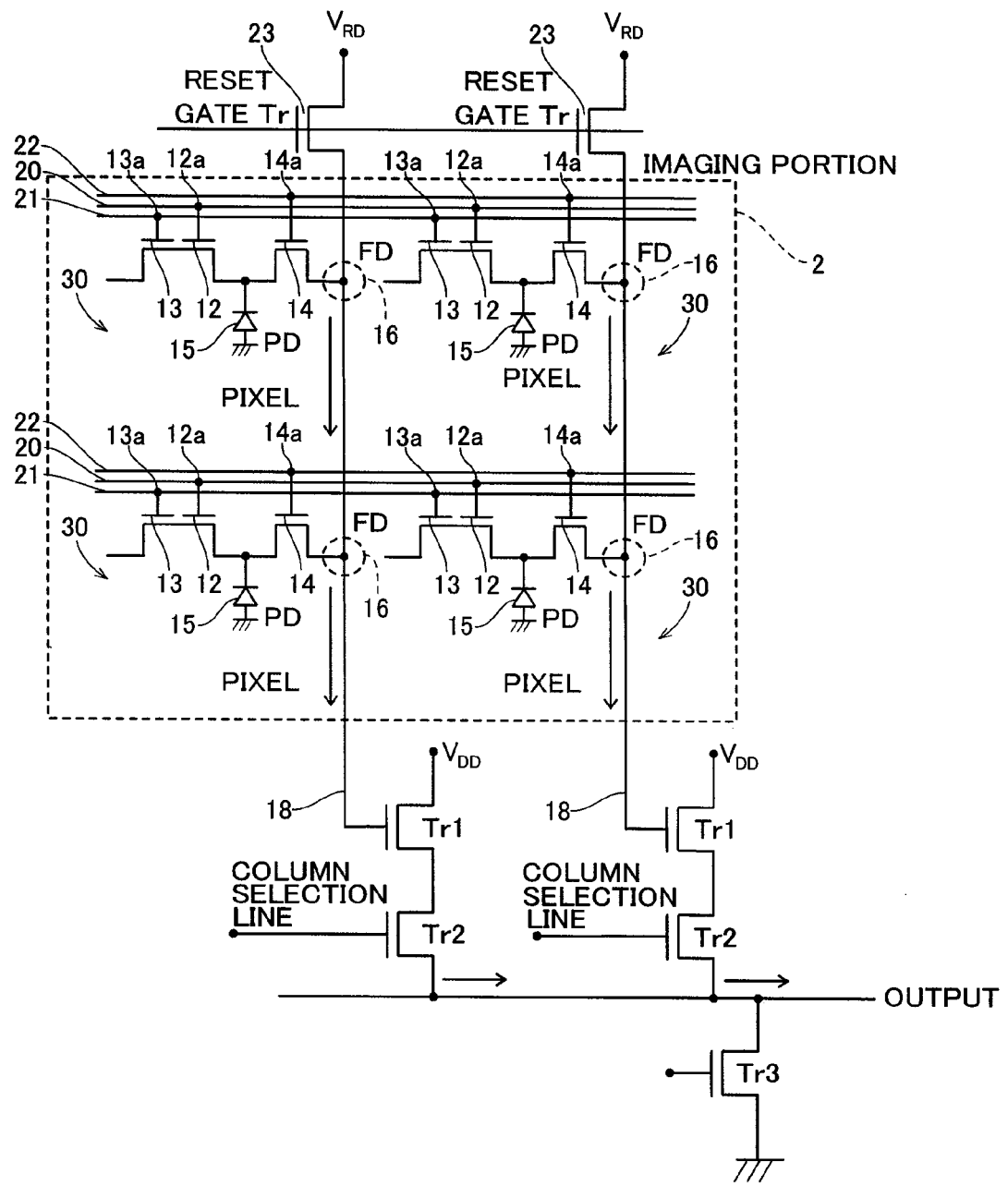
FIG. 10 is a circuit diagram for illustrating an imaging operation of the CMOS image sensor according to the second embodiment of the present invention.

An imaging operation of the CMOS image sensor according to the second embodiment will be now described with reference to FIGS. 9 and 10.

First, an initialization is performed with respect to the photodiode portions 15 of all pixels 30. Specifically, as shown in FIG. 10, all reset gate transistors 23 and all readout gate electrodes 14 are brought into an ON-state, whereby electrons stored in the photodiode portions 15 are discharged.

An image is taken in all pixels 30. Specifically, all reset gate transistors 23 and all readout gate electrodes 14 are brought into an OFF-state. At this time, all transfer gate electrodes 12 are brought into an OFF-state. Thus, electrons generated according to an amount of incident light are stored in the photodiode portions 15.

A multiplication operation similar to that of the aforementioned first embodiment is performed with respect to all pixels 30 after the lapse of a prescribed imaging period. Then, electrons multiplied are stored in the transfer channels 31 (see FIG. 9) located under the multiplication gate electrodes 13 after the multiplication operation is performed a plurality of times. At this time, all transfer gate electrodes 12 are in an OFF-state.

A readout operation of the stored electrons is performed with respect to each row. Specifically, all readout gate electrodes 14 and all reset gate transistors 23 are brought into an ON-state. Thus, during the readout operation of each row, the electrons generated in the photodiode portions 15 are discharged. Thereafter all reset gate transistors 23 are brought into an OFF-state, and the readout gate electrodes 14 in rows, with respect to which the readout operation is not performed, are brought into an OFF-state, whereby the floating diffusion regions 16 are electrically floated. Then, the transfer gate electrodes 12 are brought into an ON-state, the multiplication gate electrodes 13 are brought into an OFF-state, whereby the electrons stored in the transfer channels 31 located under the multiplication gate electrodes 13 are transferred to the transfer channels 31 located under the transfer gate electrodes 12. The transfer gate electrodes 12 are brought into an OFF-state, whereby the electrons transferred to the transfer channels 31 located under the transfer gate electrodes 12 are supplied to the floating diffusion regions 16 through the photodiode portions 15 and the transfer channels 32 (see FIG. 9) located under the readout gate electrodes 14. Thus, a signal corresponding to the electrons supplied to the floating diffusion regions 16 appear in signal lines 18. Selection transistors Tr2 in each column are sequentially brought into an ON-state, whereby a current sequentially flows through transistors Tr1 in each column, the selection transistors Tr2 in each column, and the transistors Tr3. Thus, a signal for each pixel 30, with respect to which the readout is performed, is outputted.

The readout operation of each column is performed with respect to all columns, whereby the imaging operation of the CMOS image sensor is completed.

According to the second embodiment, as hereinabove described, each readout gate electrode 14 is so provided between the photodiode portion 15 and the floating diffusion region 16 as to be adjacent to the photodiode portion 15 and the floating diffusion region 16, whereby the electrons generated in the photodiode portion 15 can be easily discharged during the readout operation of each column. Therefore, also in a case where a period of time from the lapse of the imaging period to the start of the readout operation varies in each pixel 30, the electrons generated in the photodiode portions 15 during the readout operation of each column can be inhibited from being mixed into electrons stored in the transfer channels 31 located under the multiplication gate electrodes 13 corresponding to a signal after the lapse of the imaging period. Thus, also in a case where the period of time from the lapse of the imaging period to the start of the readout operation varies in each pixel 30, a signal corresponding to electrons after the lapse of the imaging period of each pixel 30 can be accurately read. In other words, a CMOS image sensor having a global shutter function can be obtained.

The remaining effects of the second embodiment are similar to those of the aforementioned first embodiment.

Third Embodiment

Figure 11:
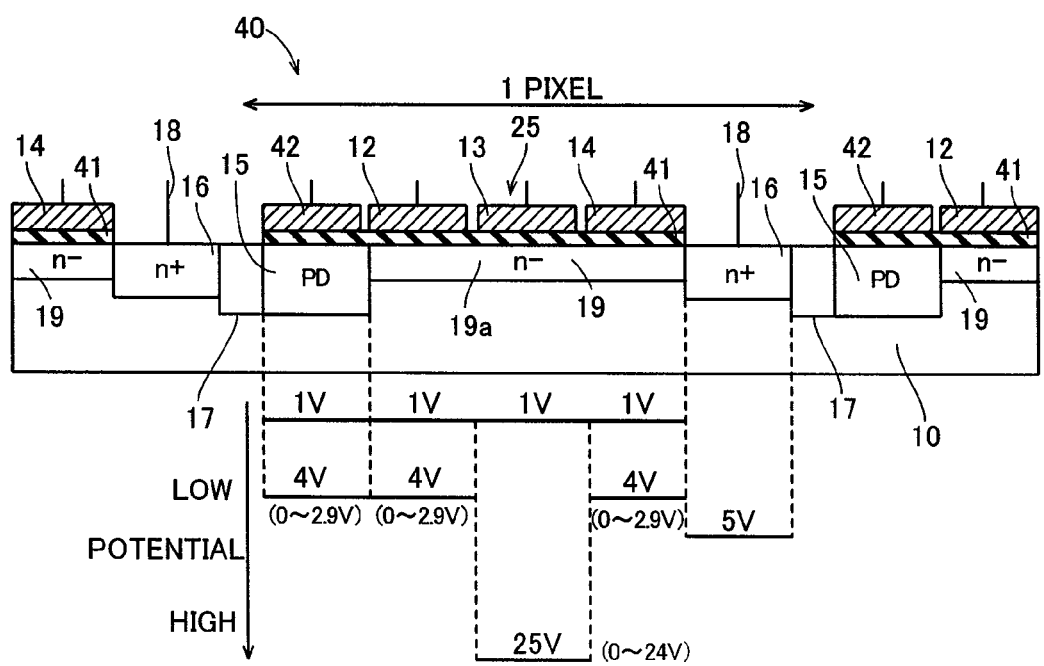
FIG. 11 is a sectional view showing a structure of a CMOS image sensor according to a third embodiment of the present invention.
Figure 12:
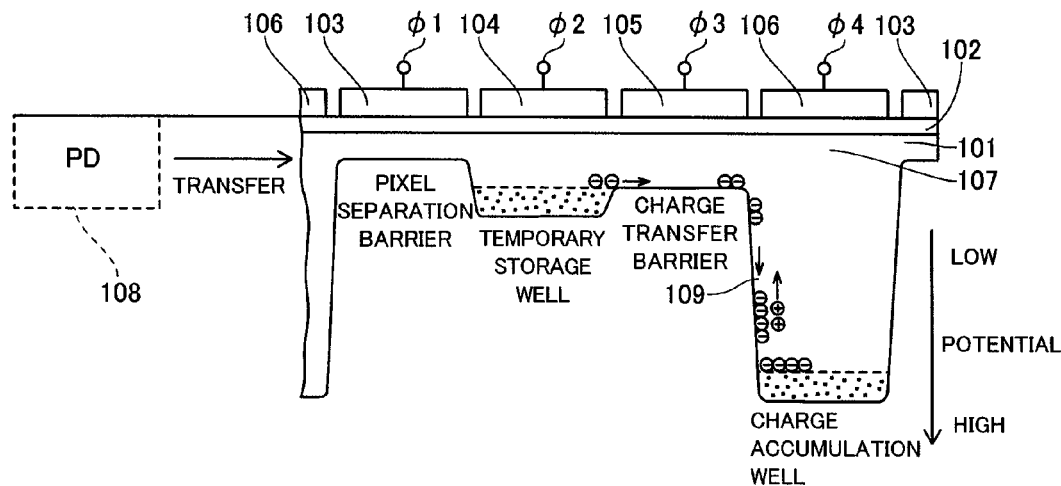
FIG. 12 is a sectional view showing a conventional CCD image sensor.
Figure 13:
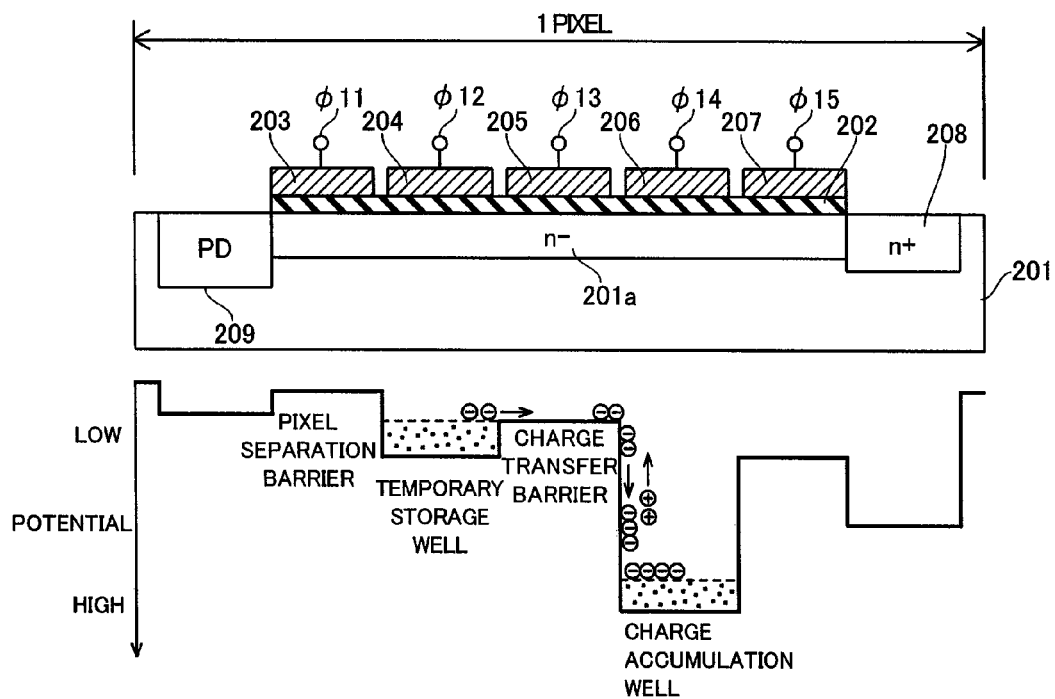
FIG. 13 is a sectional view in a case where a structure of the exemplary conventional CCD image sensor shown in FIG. 12 is applied to a CMOS image sensor.

With reference to FIG. 11, in a third embodiment, a structure of a CMOS image sensor including pixels 40 so formed that transfer gate electrodes 42 are formed on photodiode portions 15 respectively will be described dissimilarly to the aforementioned first embodiment.

As shown in FIG. 11, in a cross-sectional structure of the pixels 40 of the CMOS image sensor according to the third embodiment, gate insulating films 41 are formed on upper surfaces corresponding to the photodiode portions 15 and transfer channels 19 of a p-type silicon substrate 10. Each transfer gate electrode 42 is formed in a region corresponding to the photodiode portion 15 on the upper surface of the gate insulating film 41. The transfer gate electrodes 42 are examples of the "second transfer electrode" in the present invention. A transfer gate electrode 12, a multiplication gate electrode 13 and a readout gate electrode 14 are formed in regions corresponding to each transfer channel 19 on the upper surface of the gate insulating film 41 at prescribed intervals in order from a side of the photodiode portion 15. An ON signal (high-level signal) of a clock signal is supplied to the transfer gate electrodes 42, whereby a voltage of about 2.9 V is applied. In a case where a voltage of about 2.9 V is applied to the transfer gate electrodes 42, the photodiode portions 15 located under the transfer gate electrodes 42 are adjusted to a potential of about 4 V. In a case where an OFF signal (low-level signal) of the clock signal is supplied to the transfer gate electrodes 42, the photodiode portions 15 are adjusted to a potential of about 1 V.

The remaining structures of the third embodiment are similar to those of the aforementioned first embodiment.

A transfer operation of electrons of a CMOS image sensor according to a third embodiment will be now described with reference to FIG. 11.

First, in imaging period, the transfer gate electrodes 42 are brought into an ON-state, and the transfer gate electrodes 12 are brought into an OFF-state. Therefore, the photodiode portions 15 are adjusted to a potential of about 4 V, and the transfer channels 19 located under the transfer gate electrodes 12 are adjusted to a potential of about 1 V. Thus, electrons generated according to an amount of incident light are stored in the photodiode portions 15.

In a case where the electrons stored in the photodiode portions 15 are transferred to the transfer channels 19 located under the transfer gate electrodes 12, the transfer gate electrodes 12 are brought into an ON-state and the transfer gate electrodes 42 are brought into an OFF-state. Therefore, the transfer channels 19 located under the transfer gate electrodes 12 are adjusted to a potential of about 4 V and the photodiode portions 15 are adjusted to a potential of about 1 V. Thus, the electrons stored in the photodiode portions 15 are transferred to the transfer channels 19 located under the transfer gate electrodes 12 adjusted to a higher potential.

On the other hand, in a case where the electrons located in the transfer channels 19 located under the transfer gate electrodes 12 are transferred to the photodiode portions 15, the transfer gate electrodes 42 are brought into an ON-state and the transfer gate electrodes 12 are brought into an OFF-state. Therefore, the photodiode portions 15 are adjusted to a potential of about 4 V, and the transfer channels 19 located under the transfer gate electrodes 12 are adjusted to a potential of about 1 V. Thus, the electrons located in the transfer channels 19 located under the transfer gate electrodes 12 are transferred to the photodiode portions 15 adjusted to a higher potential.

According to the third embodiment, as hereinabove described, the transfer gate electrodes 42 are provided on the photodiode portions 15, whereby the electrons stored in the photodiode portions 15 can be easily transferred to the transfer channels 19 located under the transfer gate electrodes 12 by the transfer gate electrodes 42, and electrons located in the transfer channels 19 located under the transfer gate electrodes 12 can be easily transferred to the photodiode portions 15.

The remaining effects of the third embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to an exemplary passive CMOS image sensor of an imaging device in the aforementioned first to third embodiments, the present invention is not restricted to this but is also applicable to an active CMOS image sensor instead of the passive CMOS image sensor.

While the present invention is applied to an exemplary CMOS image sensor of an imaging device in the aforementioned first to third embodiments, the present invention is not restricted to this but is also applicable to an imaging device other than the CMOS image sensor. For example, the present invention is applicable to a CCD image sensor of the imaging device other than the CMOS image sensor.

While the imaging device is formed on the p-type silicon substrate in the aforementioned first to third embodiments, the present invention is not restricted to this but an n-type silicon substrate formed with a p-type impurity diffusion region thereon may be alternatively used as a substrate.

While electrons are used as carriers in the aforementioned first to third embodiments, the present invention is not restricted to this but holes may be alternatively used as carriers by making a conductive type of a substrate impurity and a polarity of an applied voltage opposite.

While the common reset gate transistors 23 are provided for each column in the aforementioned first to third embodiments, the present invention is not restricted to this but a reset gate transistor may be alternatively provided for each pixel.

While the readout operation is performed with respect to each column in the aforementioned first to third embodiments, the present invention is not restricted to this but the readout operation may be alternatively performed with respect to each row.

What is claimed is:

1. An imaging device comprising:
   a carrier storage portion for storing carriers generated by photoelectric conversion, having a photoelectric conversion function;
   a multiplier section including a multiplier electrode applying a voltage for generating an electric field for multiplying carriers due to impact ionization by an electric field; and
   one first transfer electrode so provided between said carrier storage portion and said multiplier electrode as to be adjacent to said carrier storage portion and said multiplier electrode, wherein
   a voltage of said first transfer electrode is so controlled as to transfer carriers from said carrier storage portion to said multiplier section after a voltage enabling multiplication of carriers due to impact ionization is applied to said multiplier electrode,
   voltages of said first transfer electrode and said multiplier electrode are so controlled as to return said carrier multiplied due to impact ionization to said carrier storage portion, and
   a voltage of said first transfer electrode is so controlled as to transfer said carrier returned from said multiplier section to said carrier storage portion to said multiplier section again.

2. The imaging device according to claim 1, wherein
   a voltage of said first transfer electrode is so controlled as to transfer said carriers from said multiplier section to said carrier storage portion after a voltage smaller than a voltage applied to adjacent said first transfer electrode is applied to said multiplier electrode.

3. The imaging device according to claim 1, further comprising:
   a carrier-number-based voltage converting portion converting the number of multiplied carriers to a voltage; and
   a readout electrode for transferring carriers to said carrier-number-based voltage converting portion, wherein
   said carrier storage portion, said multiplier section having said multiplier electrode, said first transfer electrode, said carrier-number-based voltage converting portion, and said readout electrode are included in one pixel.

4. The imaging device according to claim 3, further comprising a common first wiring layer connected to said multiplier electrodes of a plurality of said pixels, for applying a voltage enabling impact ionization of carriers to a plurality of said multiplier electrodes.

5. The imaging device according to claim 3, further comprising a common second wiring layer connected to said first transfer electrodes of a plurality of said pixels, for applying a voltage to a plurality of said first transfer electrodes.

6. The imaging device according to claim 3, further comprising a common third wiring layer connected to said readout electrodes of a plurality of said pixels, for applying a voltage to a plurality of said readout electrodes.

7. The imaging device according to claim 3, wherein
   said readout electrode is so provided between said multiplier electrode and said carrier-number-based voltage converting portion as to be adjacent to said multiplier electrode and said carrier-number-based voltage converting portion.

8. The imaging device according to claim 7, wherein
   a first transfer channel is so provided below said first transfer electrode, said multiplier electrode and said readout electrode as to couple said carrier storage portion and said carrier-number-based voltage converting portion.

9. The imaging device according to claim 8, wherein
   said carrier storage portion is adjusted to a first potential, and
   said first transfer electrode adjusts said first transfer channel located under said first transfer electrode to a second potential higher than said first potential of said carrier storage portion in a case of an ON-state, and adjusts said first transfer channel located under said first transfer electrode to a third potential lower than said first potential of said carrier storage portion in a case of an OFF-state.

10. The imaging device according to claim 9, wherein
    said multiplier electrode adjusts said first transfer channel located under said multiplier electrode to a fourth potential higher than said second potential and multiplying carriers due to impact ionization in a case of an ON-state, and adjusts said first transfer channel located under said multiplier electrode to said third potential lower than said second potential in a case of an OFF-state.

11. The imaging device according to claim 10, wherein
    said carrier-number-based voltage converting portion is adjusted to a fifth potential, and
    said readout electrode adjusts said first transfer channel located under said readout electrode to said second potential lower than said fifth potential and higher than said third potential in a case of an ON-state, and adjusts said first transfer channel located under said readout electrode to said third potential in a case of an OFF-state.

12. The imaging device according to claim 3, wherein
    said readout electrode is so provided between said carrier storage portion and said carrier-number-based voltage converting portion as to be adjacent to said carrier storage portion and said carrier-number-based voltage converting portion.

13. The imaging device according to claim 12, wherein
a second transfer channel is so provided below said first transfer electrode and said multiplier electrode as to be adjacent to said carrier storage portion.

14. The imaging device according to claim 12, wherein
a third transfer channel is so provided below said readout electrode as to couple said carrier storage portion and said carrier-number-based voltage converting portion.

15. The imaging device according to claim 14, wherein
said carrier storage portion is adjusted to a sixth potential,
said carrier-number-based voltage converting portion is adjusted to a seventh potential, and
said readout electrode adjusts said third transfer channel located under said readout electrode to an eighth potential lower than said seventh potential and higher than said sixth potential in a case of an ON-state, and adjusts said third transfer channel under said readout electrode to a ninth potential lower than said sixth potential in a case of an OFF-state.

16. The imaging device according to claim 3, further comprising an element separation region for separating pixels.

17. The imaging device according to claim 1, further comprising a second transfer electrode so provided above said carrier storage portion as to be adjacent to said first transfer electrode.

* * * * *